(12) United States Patent
Steffens et al.

(10) Patent No.: US 12,710,500 B2
(45) Date of Patent: Aug. 18, 2026

(54) MEASUREMENT DEVICE, ESPECIALLY VECTOR NETWORK ANALYZER, CALIBRATION

(71) Applicant: Rohde & Schwarz GmbH & Co. KG, Munich (DE)

(72) Inventors: Johannes Steffens, Rosenheim (DE); Florian Ramian, Karlsfeld (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 155 days.

(21) Appl. No.: 18/775,398

(22) Filed: Jul. 17, 2024

(65) Prior Publication Data

US 2025/0102609 A1 Mar. 27, 2025

(30) Foreign Application Priority Data

Sep. 27, 2023 (EP) .................................... 23199936

(51) Int. Cl.
*G01R 35/00* (2006.01)
*G01R 29/08* (2006.01)

(52) U.S. Cl.
CPC ....... *G01R 35/005* (2013.01); *G01R 29/0878* (2013.01)

(58) Field of Classification Search
CPC ... G01R 35/005; G01R 29/0878; G01R 27/28
See application file for complete search history.

(56) References Cited

U.S. PATENT DOCUMENTS 5,552,714 A * 9/1996 Adamian ............. G01R 35/005 333/17.1
6,417,674 B1 * 7/2002 Rowell, Jr. .......... G01R 35/005 324/637

(Continued)

FOREIGN PATENT DOCUMENTS

| | | | |
|---|---|---|---|
| CA | 2650359 | A1 | 7/2009 |
| EP | 1181562 | B1 | 3/2007 |
| EP | 3232218 | B1 | 6/2022 |

OTHER PUBLICATIONS

Extended European Search Report issued in EP 23199936.8-1001 by the European Patent Office on Mar. 25, 2024.

*Primary Examiner* — Thang X Le
(74) *Attorney, Agent, or Firm* — Studebaker Brackett PLLC

(57) ABSTRACT

A calibration device for a measurement device, especially a vector network analyzer, is provided. The calibration device includes at least one connection port for connecting the calibration device to the measurement device, especially the vector network analyzer, at least one passive calibration standard, at least one active calibration standard, and a switching unit configured to connect the at least one connection port alternatively to one of the at least one passive calibration standard and the at least one active calibration standard. The active calibration standard includes a signal measurement unit configured to measure an RF signal fed to the active calibration standard via the at least one connection port and the switching unit in magnitude and/or phase. Alternatively, the active calibration standard includes a signal generation unit configured to generate and output a reference signal to the at least one connection port via the switching unit.

14 Claims, 10 Drawing Sheets

(56) References Cited

U.S. PATENT DOCUMENTS

| | | | | |
|---|---|---|---|---|
| 6,529,844 | B1 | 3/2003 | Kapetanic et al. | |
| 6,917,892 | B2 | 7/2005 | Bradley et al. | |
| 7,030,625 | B1 | 4/2006 | Boudiaf et al. | |
| 7,405,575 | B2 * | 7/2008 | Tan | G01R 35/005 702/109 |
| 2004/0064774 | A1 * | 4/2004 | Fabry | G01R 35/005 714/742 |
| 2009/0160458 | A1 * | 6/2009 | Maestle | G01R 27/32 324/601 |
| 2024/0056107 | A1 * | 2/2024 | Rospsha | H04B 1/0057 |

* cited by examiner

MEASUREMENT DEVICE, ESPECIALLY VECTOR NETWORK ANALYZER, CALIBRATION

The invention relates to a calibration device for a measurement device, especially a vector network analyzer, a use of such a calibration device for calibrating a measurement device, especially a vector network analyzer, a system comprising such a calibration device and a measurement device, especially a vector network analyzer, and a method for calibrating a measurement device, especially a vector network analyzer.

Generally, in times of an increasing number of applications to be tested with the aid of a measurement device, especially a vector network analyzer, there is a growing need of a calibration device for a measurement device, especially a vector network analyzer, a use of such a calibration device for calibrating a measurement device, especially a vector network analyzer, a system comprising such a calibration device and a measurement device, especially a vector network analyzer, and a method for calibrating a measurement device, especially a vector network analyzer, to ensure particularly accurate and efficient tests regarding such applications due to particularly accurate and efficient calibration of the corresponding measurement device or vector network analyzer, respectively.

Document U.S. Pat. No. 7,030,625 B1 relates to a method and apparatus for performing a minimum connection multiport through-reflect-line calibration and measurement. Disadvantageously, the configuration disclosed by said document does not allow for a fully automated calibration, thereby not only lacking a particularly efficient calibration of the corresponding vector network analyzer but also being prone to calibration errors.

Accordingly, there is the object to provide a calibration device for a measurement device, especially a vector network analyzer, a use of such a calibration device for calibrating a measurement device, especially a vector network analyzer, a system comprising such a calibration device and a measurement device, especially a vector network analyzer, and a method for calibrating a measurement device, especially a vector network analyzer, to ensure a particularly accurate and efficient calibration of a measurement device or a vector network analyzer, respectively, thereby allowing for performing particularly accurate and efficient measurements and tests with the aid of the respective measurement device or vector network analyzer, respectively.

This object is solved by the features of the first independent claim for a calibration device for a measurement device, especially a vector network analyzer, the features of the second independent claim for a use of such a calibration device for calibrating a measurement device, especially a vector network analyzer, the features of the third independent claim for a system comprising such a calibration device and a measurement device, especially a vector network analyzer, and the features of the fourth independent claim for a method for calibrating a measurement device, especially a vector network analyzer. The dependent claims contain further developments.

According to a first aspect of the present invention, a calibration device for a measurement device, especially a vector network analyzer, is provided. Said calibration device comprises at least one connection port for connecting the calibration device to the measurement device, especially the vector network analyzer, at least one passive calibration standard, at least one active calibration standard, and a switching unit configured to connect the at least one connection port alternatively to one of the at least one passive calibration standard and the at least one active calibration standard. In this context, the at least one active calibration standard comprises a signal measurement unit configured to measure a RF signal fed to the at least one active calibration standard via the at least one connection port and the switching unit in magnitude and/or phase. Alternatively, the at least one active calibration standard comprises a signal generation unit configured to generate and output a reference signal to the at least one connection port via the switching unit.

Advantageously, a particularly accurate and efficient calibration of a measurement device or a vector network analyzer, respectively, can be ensured, thereby allowing for performing particularly accurate and efficient measurements and tests with the aid of the respective measurement device or vector network analyzer, respectively.

Further advantageously, calibration can fully be automated, thereby further reducing both inaccuracies and inefficiencies.

With respect to the above-mentioned at least one active calibration standard, it is noted that it might be particularly advantageous if said at least one active calibration standard is traceable calibrated preferably according to at least one national standard.

With respect to the above-mentioned reference signal, it is noted that it might be particularly advantageous if said reference signal is known in amplitude and/or phase and/or frequency. Furthermore, the reference signal may be traceable.

According to an implementation form of the first aspect of the present invention, the calibration device comprises a control interface configured to connect the calibration device to a control device, especially to the measurement device or the vector network analyzer. In this context, the switching unit is configured to receive a control signal via the control interface and is in turn configured to connect the at least one passive calibration standard and/or the at least one active calibration standard to the at least one connection port in respect to the control signal.

Advantageously, for instance, a self-calibration of the respective measurement device or vector network analyzer, respectively, can efficiently be implemented.

According to a further implementation form of the first aspect of the present invention, the calibration device comprises at least one DUT (device under test) connection port for connecting the calibration device to a DUT. In this context, the switching unit is configured to connect the at least one connection port to the at least one DUT connection port.

Advantageously, for example, the calibration device can especially act as an inline calibration unit. Accordingly, the calibration device can remain connected to the measurement device or network vector analyzer, respectively, all the time. Calibration can be done without adding the calibration device to the respective port of the measurement device or vector network analyzer, respectively. Only the DUT is changed.

According to a further implementation form of the first aspect of the present invention, the calibration device comprises at least one further connection port. In this context, the switching unit is configured to alternatively connect the at least one further connection port to the at least one passive calibration standard and the at least one active calibration standard, or to at least one further passive calibration standard, especially comprised by the calibration device, and at least one further active calibration standard, especially comprised by the calibration device, or to at least one further passive calibration standard, especially comprised by the calibration device, and the at least one active calibration standard.

Advantageously, for instance, only the at least one active calibration standard can be shared for the at least one further connection port, thereby not only reducing costs and required space but also preventing heat becoming too high.

According to a further implementation form of the first aspect of the present invention, the switching unit is configured to connect the at least one connection port to the at least one further connection port.

Advantageously, for example, both an unknown open short match calibration and a through open short match calibration, wherein through is especially known, are possible.

According to a further implementation form of the first aspect of the present invention, the switching unit comprises one or more switching stages.

Advantageously, for instance, flexibility, and thus efficiency, can further be increased.

According to a further implementation form of the first aspect of the present invention, the switching unit comprises one or more switching elements, especially one or more electronic switching elements and/or one or more mechanical switching elements.

Advantageously, for example, such a switching element may comprise at least one of a transistor, a diode, a relay, or any combination thereof.

According to a further implementation form of the first aspect of the present invention, the calibration device comprises a housing. In this context, the at least one active calibration standard is arranged within said housing or in a housing separate to the housing of the calibration device.

Advantageously, for instance, heat can efficiently be dissipated.

According to a further implementation form of the first aspect of the present invention, the at least one active calibration standard or the signal generation unit comprises or is a pulse source, a comb source, a noise source, or any combination thereof.

Advantageously, for example, accuracy and efficiency can further be increased.

According to a further implementation form of the first aspect of the present invention, the at least one passive calibration standard comprises or is an open calibration standard and/or a short calibration standard and/or a match calibration standard.

Advantageously, for instance, inefficiencies can further be reduced.

According to a second aspect of the present invention, it is provided a use of a calibration device for calibrating a measurement device, especially a vector network analyzer, according to the first aspect of the present invention or any of its implementation forms, respectively.

Advantageously, a particularly accurate and efficient calibration of a measurement device or a vector network analyzer, respectively, can be ensured, thereby allowing for performing particularly accurate and efficient measurements and tests with the aid of the respective measurement device or vector network analyzer, respectively.

Further advantageously, calibration can fully be automated, thereby further reducing both inaccuracies and inefficiencies.

According to a third aspect of the present invention, a system is provided. Said system comprises a calibration device according to the first aspect of the present invention or any of its implementation forms, respectively, and a measurement device, especially a vector network analyzer. In this context, the at least one connection port of the calibration device is preferably connected to the measurement device, especially the vector network analyzer.

Advantageously, a particularly accurate and efficient calibration of a measurement device or a vector network analyzer, respectively, can be ensured, thereby allowing for performing particularly accurate and efficient measurements and tests with the aid of the respective measurement device or vector network analyzer, respectively.

Further advantageously, calibration can fully be automated, thereby further reducing both inaccuracies and inefficiencies.

According to an implementation form of the third aspect of the present invention, the measurement device, especially the vector network analyzer, is configured to control the calibration device preferably in such a way that the at least one passive calibration standard and the at least one active calibration standard are connected to the measurement device, especially the vector network analyzer, in an alternative manner.

Advantageously, for instance, a self-calibration of the measurement device or the vector network analyzer, respectively, can efficiently be implemented.

According to a further implementation form of the third aspect of the present invention, the measurement device, especially the vector network analyzer, is configured to measure at least one corresponding S-parameter.

Advantageously, for example, efficiency can further be increased.

According to a fourth aspect of the present invention, a method for calibrating a measurement device, especially a vector network analyzer, is provided. Said method comprises the steps of connecting at least one connection port of a calibration device alternatively to one of at least one passive calibration standard especially of the calibration device and at least one active calibration standard especially of the calibration device preferably with the aid of a switching unit, more preferably with the aid of a switching unit of the calibration device, measuring a RF signal fed to the at least one active calibration standard via the at least one connection port and especially the switching unit in magnitude and/or phase preferably with the aid of a signal measurement unit, more preferably with the aid of a signal measurement unit of the at least one active calibration standard, or generating and outputting a reference signal to the at least one connection port especially via the switching unit preferably with the aid of a signal generation unit, more preferably with the aid of a signal generation unit of the at least one active calibration standard.

Advantageously, a particularly accurate and efficient calibration of a measurement device or a vector network analyzer, respectively, can be ensured, thereby allowing for performing particularly accurate and efficient measurements and tests with the aid of the respective measurement device or vector network analyzer, respectively.

Further advantageously, calibration can fully be automated, thereby further reducing both inaccuracies and inefficiencies.

Exemplary embodiments of the invention are now further explained with respect to the drawings by way of example only, and not for limitation. In the drawings.

In advance, with respect to all the explanations below, it is noted that calibration is exemplarily elucidated in the context of a vector network analyzer, especially the vector network analyzer 10, to be calibrated. Nevertheless, said vector network analyzer or said vector network analyzer 10, respectively, can be replaced by another measurement device such as a network analyzer, a component analyzer, a signal analyzer, a spectrum analyzer, or any combination thereof.

Figure 1:
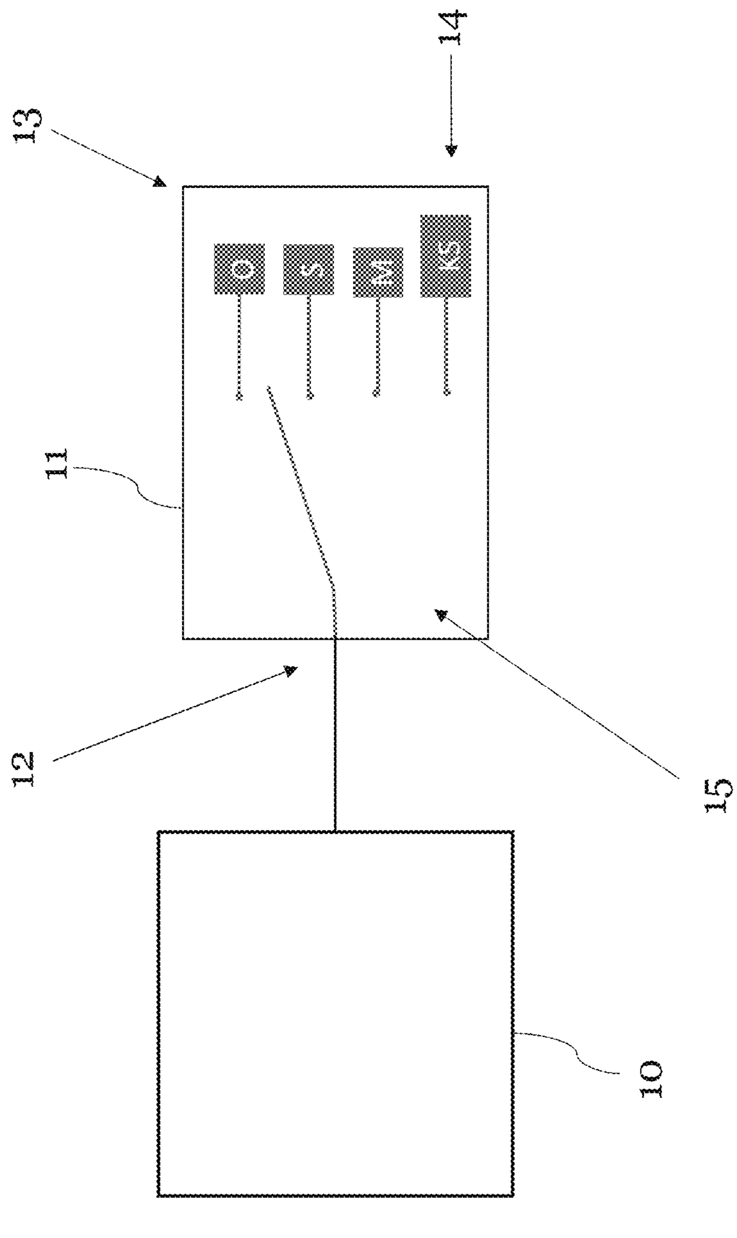
FIG. 1 shows a first exemplary embodiment of the calibration device.

Firstly, with respect to FIG. 1, a first exemplary embodiment of a calibration device 11 for a vector network analyzer 10 is depicted.

In accordance with said FIG. 1, the calibration device 11 comprises at least one connection port, exemplarily the connection port 12, for connecting the calibration device 11 to the vector network analyzer 10, at least one passive calibration standard, exemplarily three passive calibration standards 13, especially an open, a short and a match calibration standard, at least one active calibration standard, exemplarily an active calibration standard 14, especially a known source or a known sink, and a switching unit 15.

In this context, the switching unit 15 is configured to connect the at least one connection port or the connection port 12, respectively, alternatively to one of the at least one passive calibration standard 13 and the at least one active calibration standard 14.

As already mentioned above, the at least one active calibration standard or the active calibration standard 14, respectively, can comprise or be a known source or a known sink.

Accordingly, especially in the sense of such a known sink, the at least one active calibration standard or the active calibration standard 14, respectively, comprises a signal measurement unit configured to measure a RF signal fed to the at least one active calibration standard or the active calibration standard 14, respectively, via the at least one connection port or the connection port 12, respectively, and the switching unit 15 in magnitude and/or phase.

Alternatively, especially in the sense of such a known source, the at least one active calibration standard or the active calibration standard 14, respectively, comprises a signal generation unit configured to generate and output a reference signal to the at least one connection port or the connection port 12, respectively, via the switching unit 15.

It is noted that it might be particularly advantageous if the calibration device 11 comprises a control interface configured to connect the calibration device 11 to a control device, especially to the vector network analyzer 10, wherein the switching unit 15 is configured to receive a control signal via the control interface and is in turn configured to connect the at least one passive calibration standard, exemplarily the three passive calibration standards 13, and/or the at least one active calibration standard, exemplarily the active calibration standard 14, to the at least one connection port, exemplarily the connection port 12, in respect to the control signal. It is further noted that this may analogously apply for each of the following embodiments of the calibration device.

With respect to the following embodiments of the calibration device, it is noted that identical or analogous parts or elements, respectively, of each of said embodiments or not explicitly explained again but rather equipped with the same reference signs or a reference sign being increased by ten or an integer multiple of ten or a reference sign with letter extension. For such identical or analogous parts or elements, respectively, the explanations above can analogously apply, and vice versa.

Figure 2:
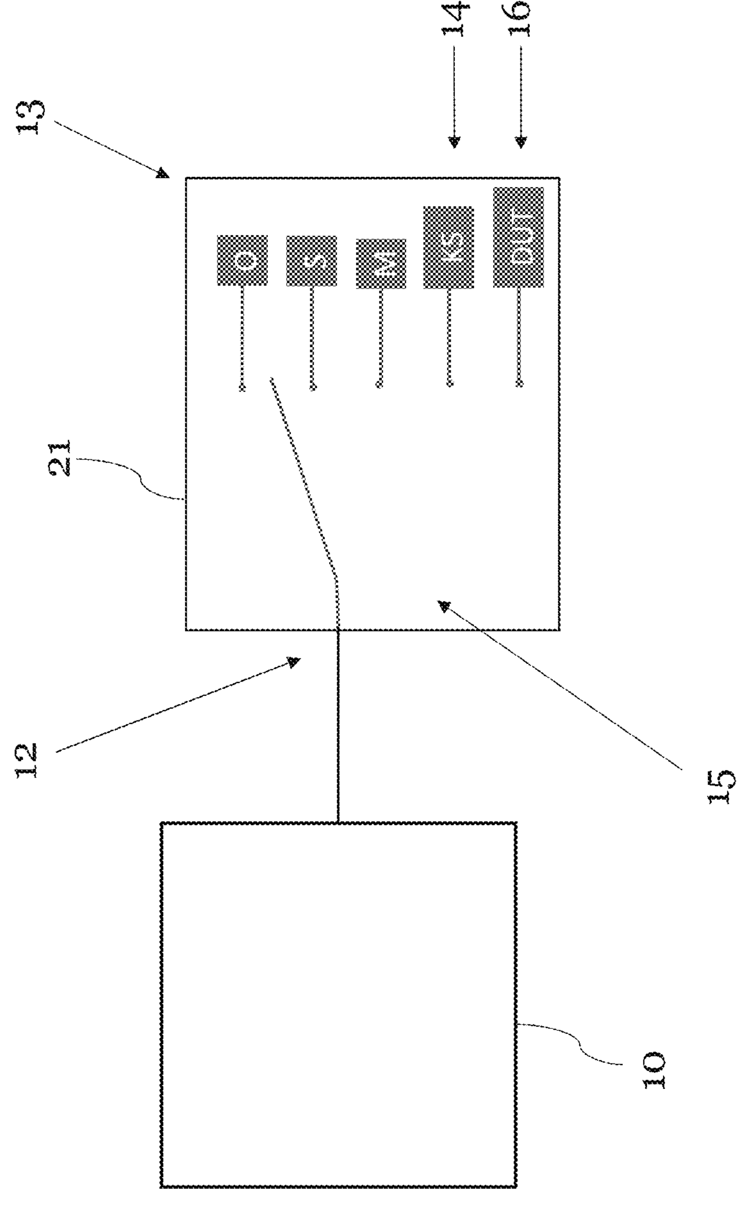
FIG. 2 shows second exemplary embodiment of the calibration device.

Now, with respect to FIG. 2, a second exemplary embodiment of a calibration device 21 is illustrated. Said calibration device 21 comprises at least one DUT connection port, exemplarily the DUT connection port 16, for connecting the calibration device to a DUT.

In this context, the switching unit 15 is configured to connect the at least one connection port, exemplarily the connection port 12, to the at least one DUT connection port or the DUT connection port 16, respectively.

It is noted that the calibration device 21 may especially be an inline calibration device.

Figure 3:
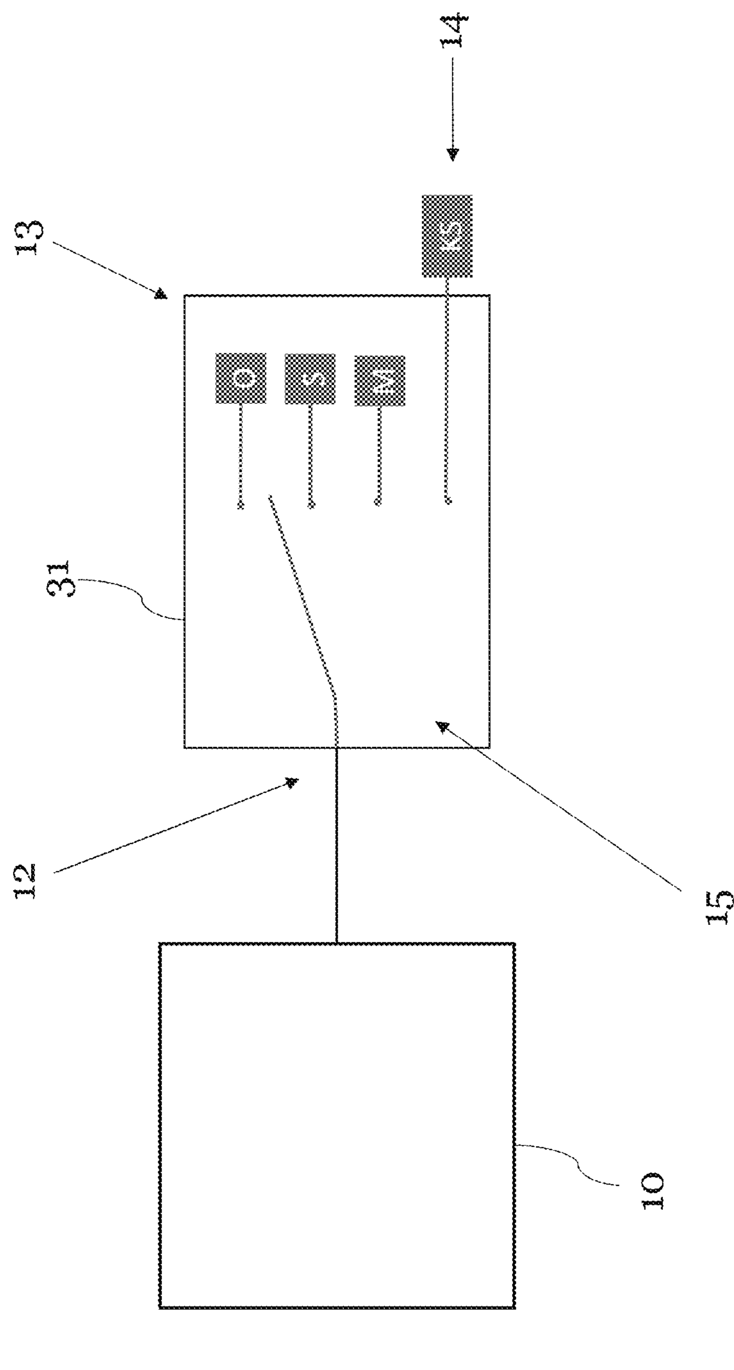
FIG. 3 shows a third embodiment of the calibration device.

In accordance with FIG. 3, a third exemplary embodiment of a calibration device 31 is shown, which is based on FIG. 1 differs from said FIG. 1 especially in that the at least one active calibration standard, exemplarily the active calibration standard 14, is arranged in an external manner with respect to a housing of the calibration device 31. Advantageously, heat can efficiently be dissipated.

Figure 4:
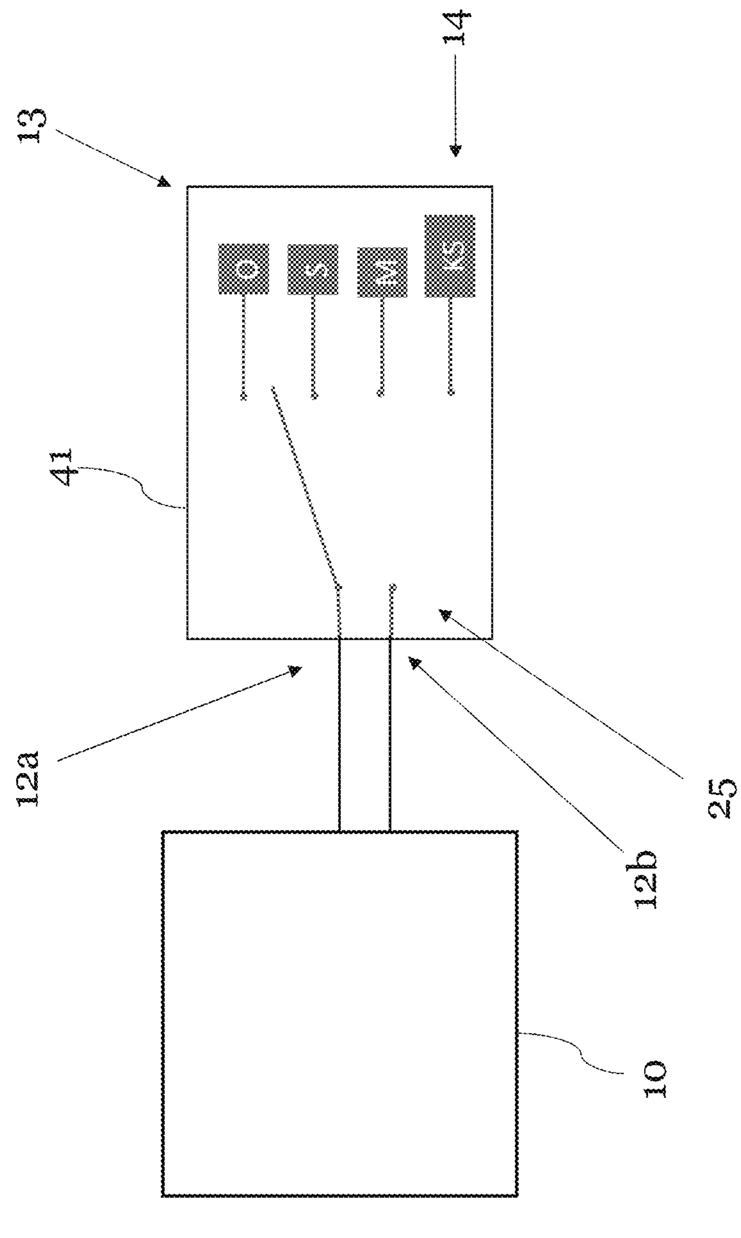
FIG. 4 shows a fourth exemplary embodiment of the calibration device.

According to a fourth exemplary embodiment of FIG. 4, the calibration device 41 comprises at least one further connection port, exemplarily the further connection port 12*b*, in addition to the connection port 12*a*.

In this context, the switching unit 25 is configured to alternatively connect the at least one further connection port, exemplarily the further connection port 12*b*, to the at least one passive calibration standard, exemplarily the three passive calibration standards 13, and the at least one active calibration standard, exemplarily the active calibration standard 14.

For the sake of completeness, it is noted that in another embodiment of the calibration device, which is not explicitly shown, the two connection ports 12*a*, 12*b* of FIG. 4 can be expanded to multiple connection ports or N connection ports, respectively.

Figure 5:
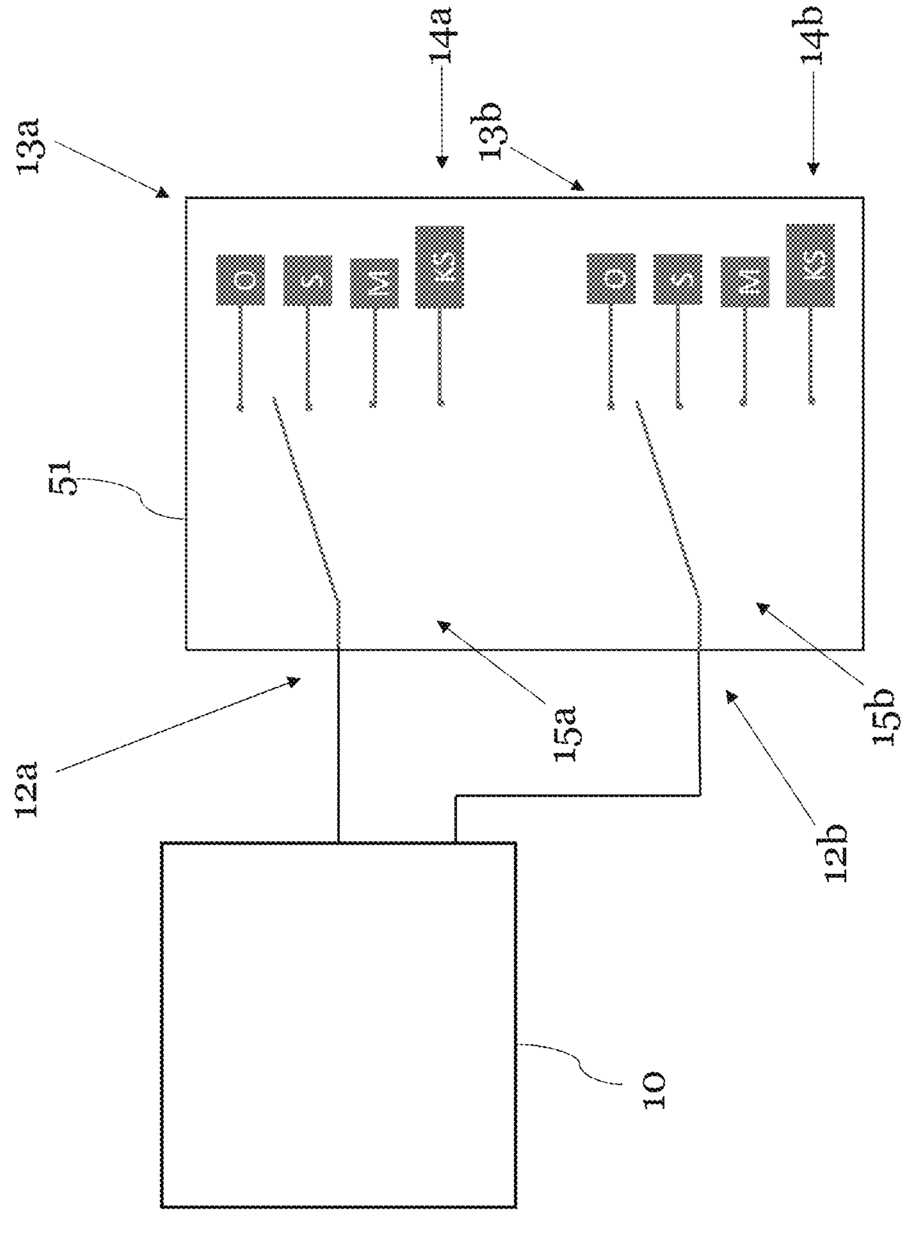
FIG. 5 shows a fifth exemplary embodiment of the calibration device.

Now, with respect to FIG. 5, a fifth exemplary embodiment of a calibration device 51 is depicted.

Said calibration device 51 comprises at least one further passive calibration standard, exemplarily three further passive calibration standards 13*b*, in addition to the at least one passive calibration standard, exemplarily the three passive calibration standards 13*a*. It is noted that the explanations regarding the at least one passive calibration standard or the three passive calibration standards 13, 13*a*, respectively, can analogously apply for the at least one further passive calibration standard or the three further passive calibration standards 13*b*, respectively, and vice versa.

Furthermore, said calibration device 51 comprises at least one further active calibration standard, exemplarily the further active calibration standard 14*b*, in addition to the at least one active calibration standard, exemplarily the active calibration standard 14*a*. It is noted that the explanations regarding the at least one active calibration standard or the active calibration standard 14, 14*a*, respectively, can analogously apply for the at least one further active calibration standard or the further active calibration standard 14*b*, respectively, and vice versa.

As it can further be seen from FIG. 5, the switching unit, exemplarily comprising the switching stages 15*a* and 15*b*, is configured to alternatively connect the at least one further connection port, exemplarily the further connection port 12*b*, to the at least one further passive calibration standard, exemplarily the three further passive calibration standards 13*b*, and the at least one further active calibration standard, exemplarily the further active calibration standard 14*b*.

Figure 6A:
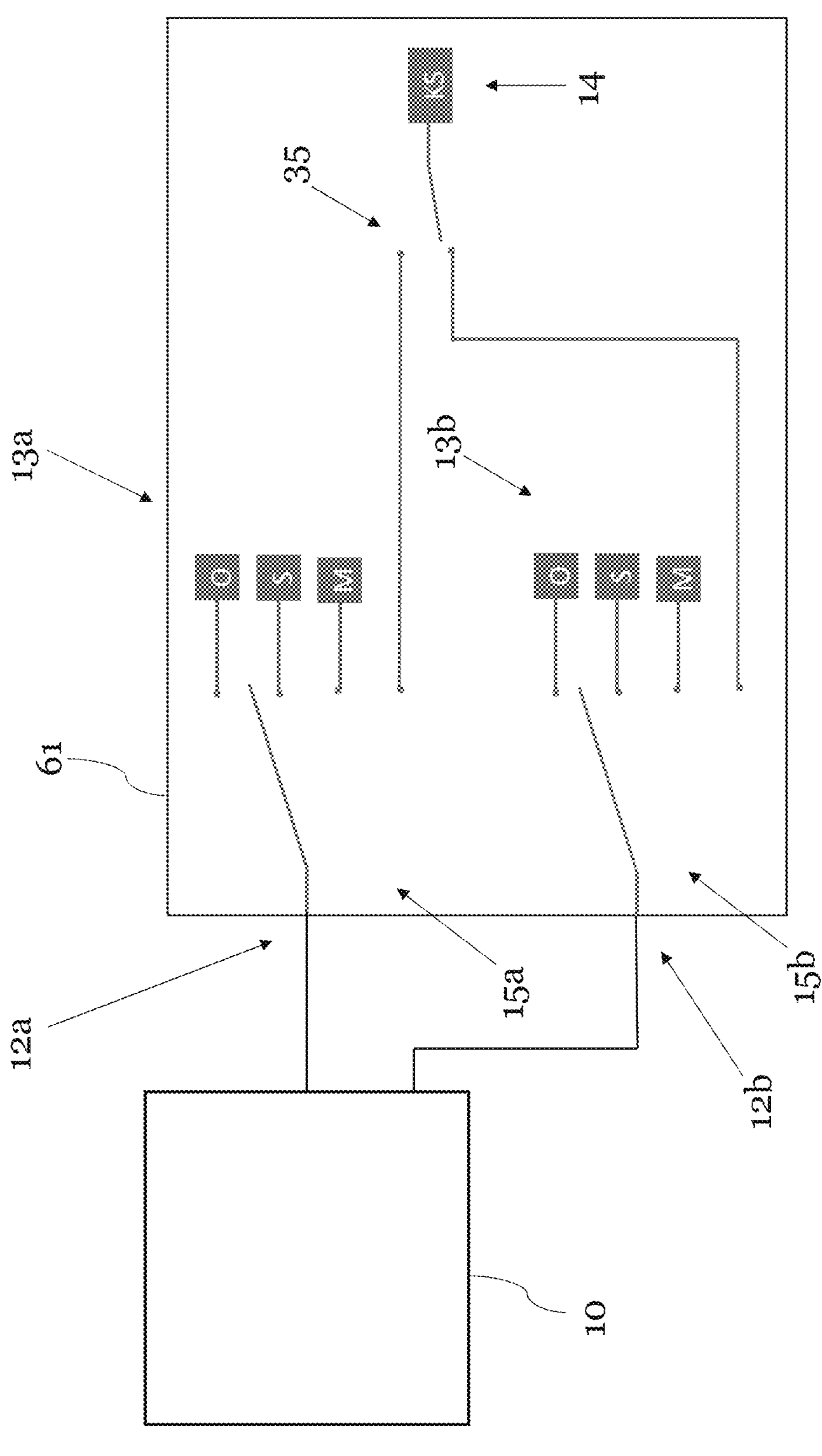
FIG. 6A shows a sixth exemplary embodiment of the calibration device.

Moreover, in accordance with FIG. 6A illustrating a sixth exemplary embodiment of a calibration device 61, the switching unit, exemplarily comprising the switching stages 15*a*, 15*b*, and 35, is configured to alternatively connect the at least one further connection port, exemplarily the further connection port 12*b*, to the at least one further passive calibration standard, exemplarily the three further passive calibration: standards 13*b*, and the at least one active calibration standard, exemplarily the active calibration standard 14.

Advantageously, in this exemplary case according to FIG. 6A, the at least one active calibration standard or the active calibration standard 14, respectively, can be shared for the at least one connection port, exemplarily the connection port 12*a*, and the at least one further connection port, exemplarily the further connection port 12*b*. Accordingly, not only costs and required space can be saved but also heat can efficiently be dissipated.

Figure 6B:
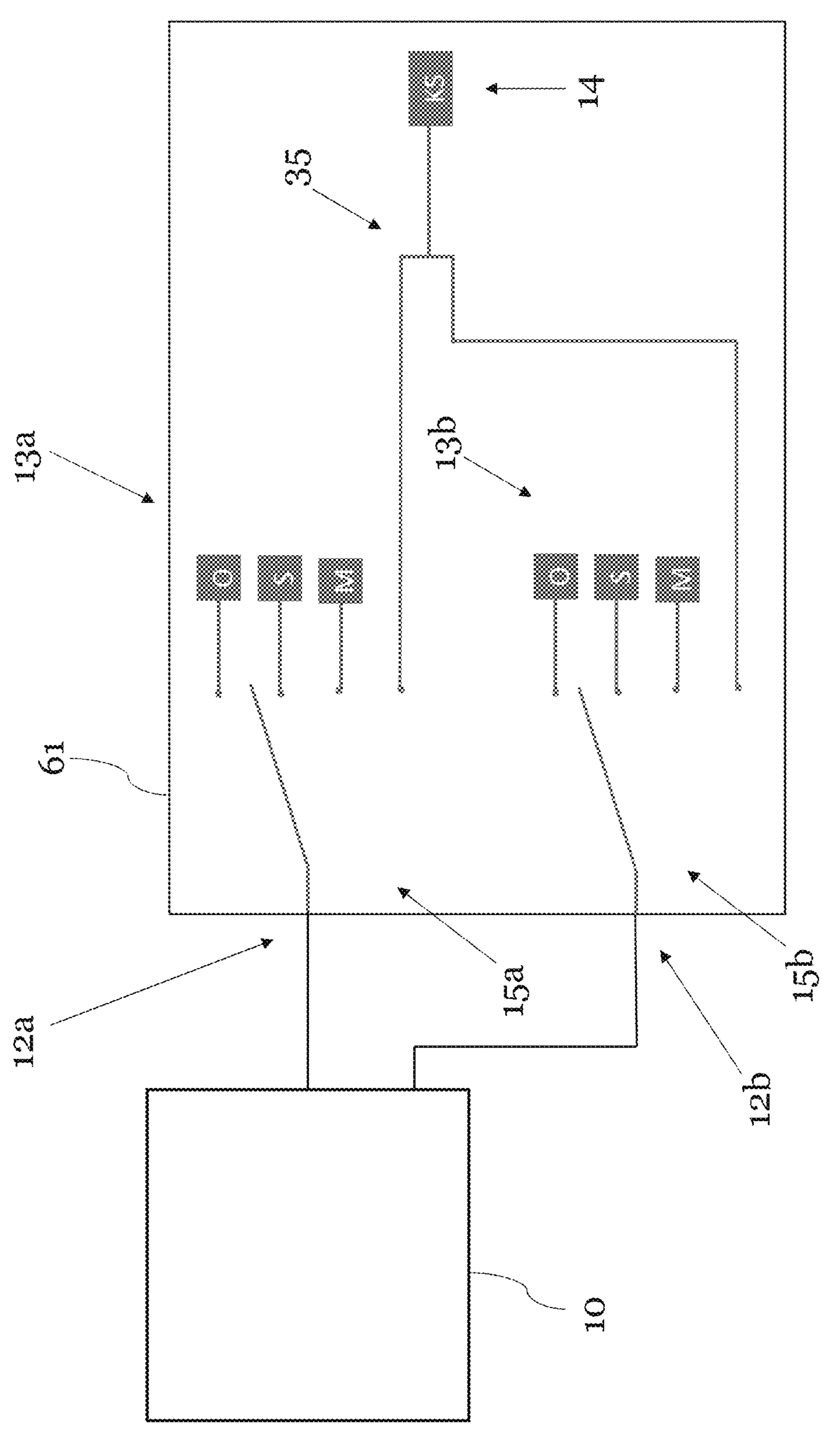
FIG. 6B shows a variant of the sixth exemplary embodiment according to FIG. 6A.

It is noted that FIG. 6B depicts a variation of the embodiment according to FIG. 6A. Said variation according to FIG. 6B differs from the embodiment of FIG. 6 in that the switching stage 35 has been omitted. Accordingly, it is still advantageous that the at least one active calibration standard or the active calibration standard 14, respectively, can be shared for the at least one connection port, exemplarily the connection port 12*a*, and the at least one further connection port, exemplarily the further connection port 12*b*.

As an additional advantage, the at least one active calibration standard or the active calibration standard 14, respectively, can be connected to both the at least one connection port, exemplarily the connection port 12*a*, and the at least one further connection port, exemplarily the further connection port 12*b*, in parallel.

Figure 7:
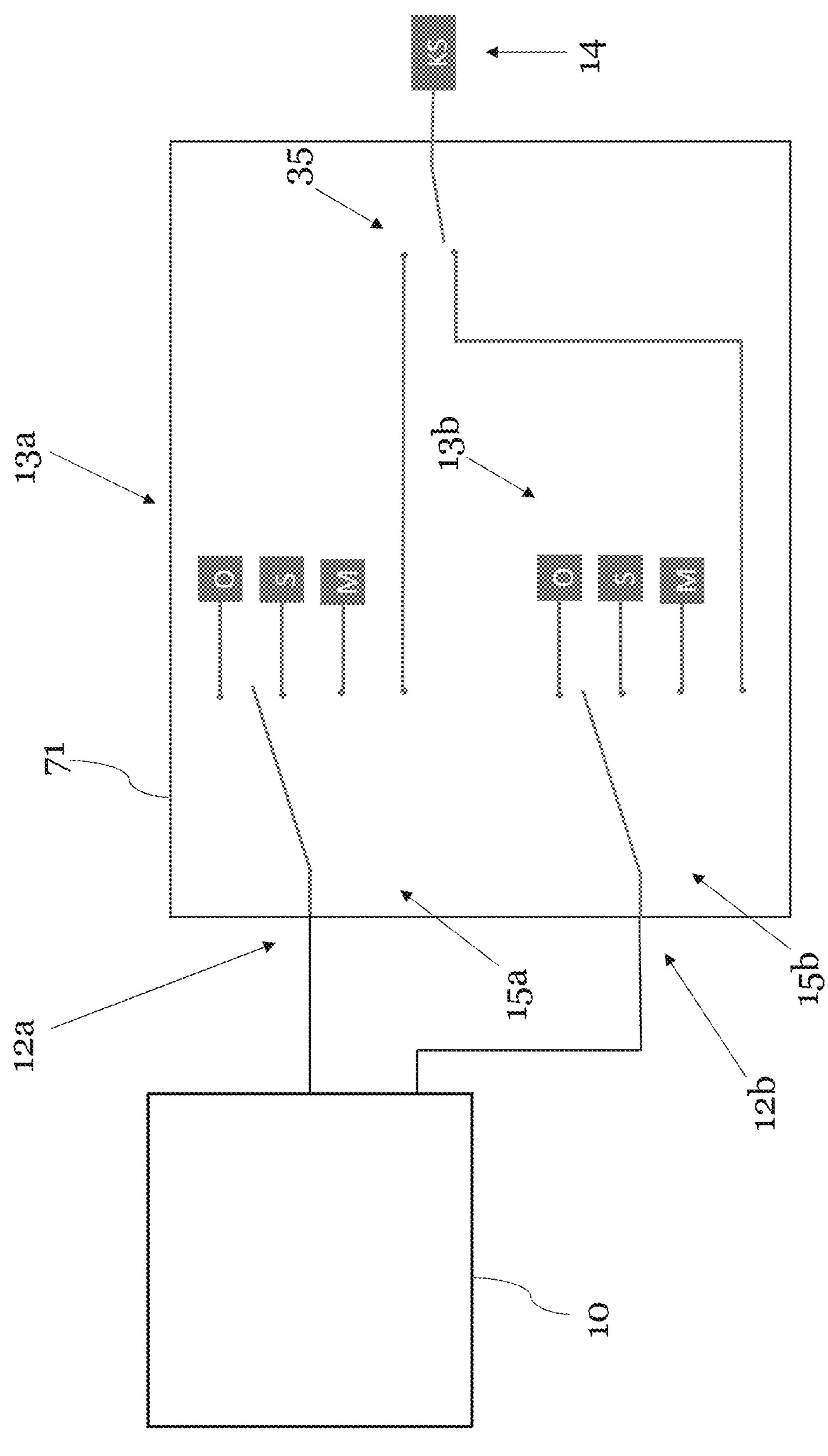
FIG. 7 shows a seventh exemplary embodiment of the calibration device.

Furthermore, the calibration device 71 of FIG. 7 is based on the calibration device 61 of FIG. 6A and especially differs therefrom in that the at least one active calibration standard, exemplarily the active calibration standard 14, is arranged in an external manner with respect to a housing of the calibration device 71. Advantageously, heat dissipation can further be improved.

Figure 8:
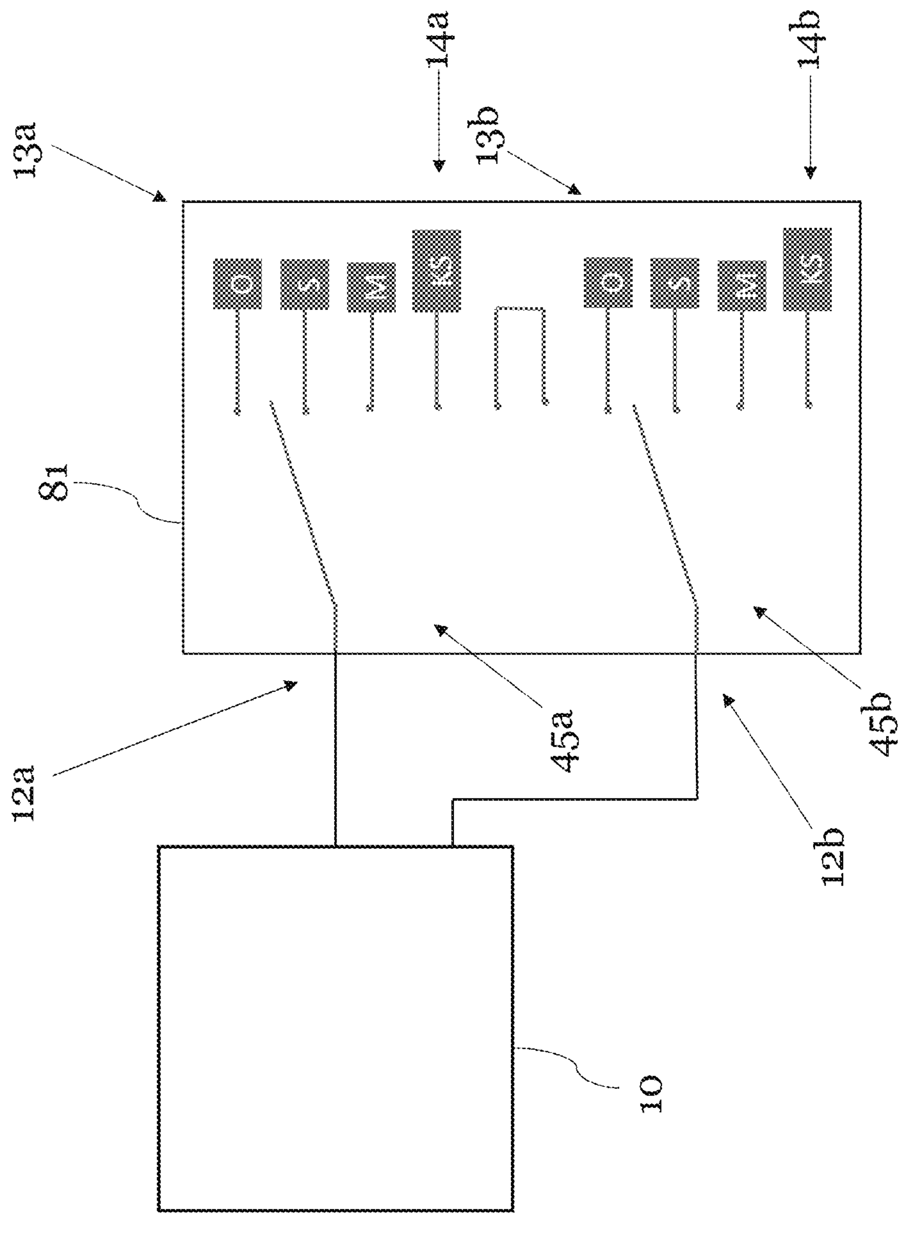
FIG. 8 shows an eighth exemplary embodiment of the calibration device.

Now, with respect to FIG. 8, an eighth exemplary embodiment of a calibration device 81 is illustrated, which is based on the calibration device 51, wherein the switching unit, exemplarily comprising the switching stages 45*a* and 45*b*, is configured to connect the at least one connection port, exemplarily the connection port 12*a*, to the at least one further connection port, exemplarily the further connection port 12*b*.

Advantageously, both an unknown open short match calibration and a through open short match calibration, wherein through is especially known, are possible.

With respect to each of the above-mentioned switching units or switching stages, respectively, it is noted that it might be particularly advantageous if such a switching unit or switching stage, respectively, comprises one or more switching elements, especially one or more electronic switching elements, such as transistors and/or diodes, and/or one or more mechanical switching elements such as relays.

It is further noted that it might be particularly advantageous if the at least one active calibration standard, exemplarily the active calibration standard 14, 14*a*, and/or the at least one further active calibration standard, exemplarily the further active calibration standard 14*b*, and/or the signal generation unit comprises or is a pulse source, a comb source, a noise source, or any combination thereof.

With respect to the above-mentioned vector network analyzer 10, it is noted that it might be particularly advantageous if the vector network analyzer 10 is configured to control the corresponding calibration device especially in such a way that the at least one passive calibration standard, exemplarily the three passive calibration standards 13, 13*a*, and the at least one active calibration standard, exemplarily the active calibration standard 14, 14*a*, are connected to the vector network analyzer 10 in an alternative manner. This can analogously apply for the elements 13*b* and 14*b* or for any combination of the elements 13, 13*a*, 13*b*, 14, 14*a*, 14*b*, respectively.

It is further noted that it might be particularly advantageous if the vector network analyzer 10 is configured to measure at least one corresponding S-parameter.

Figure 9:
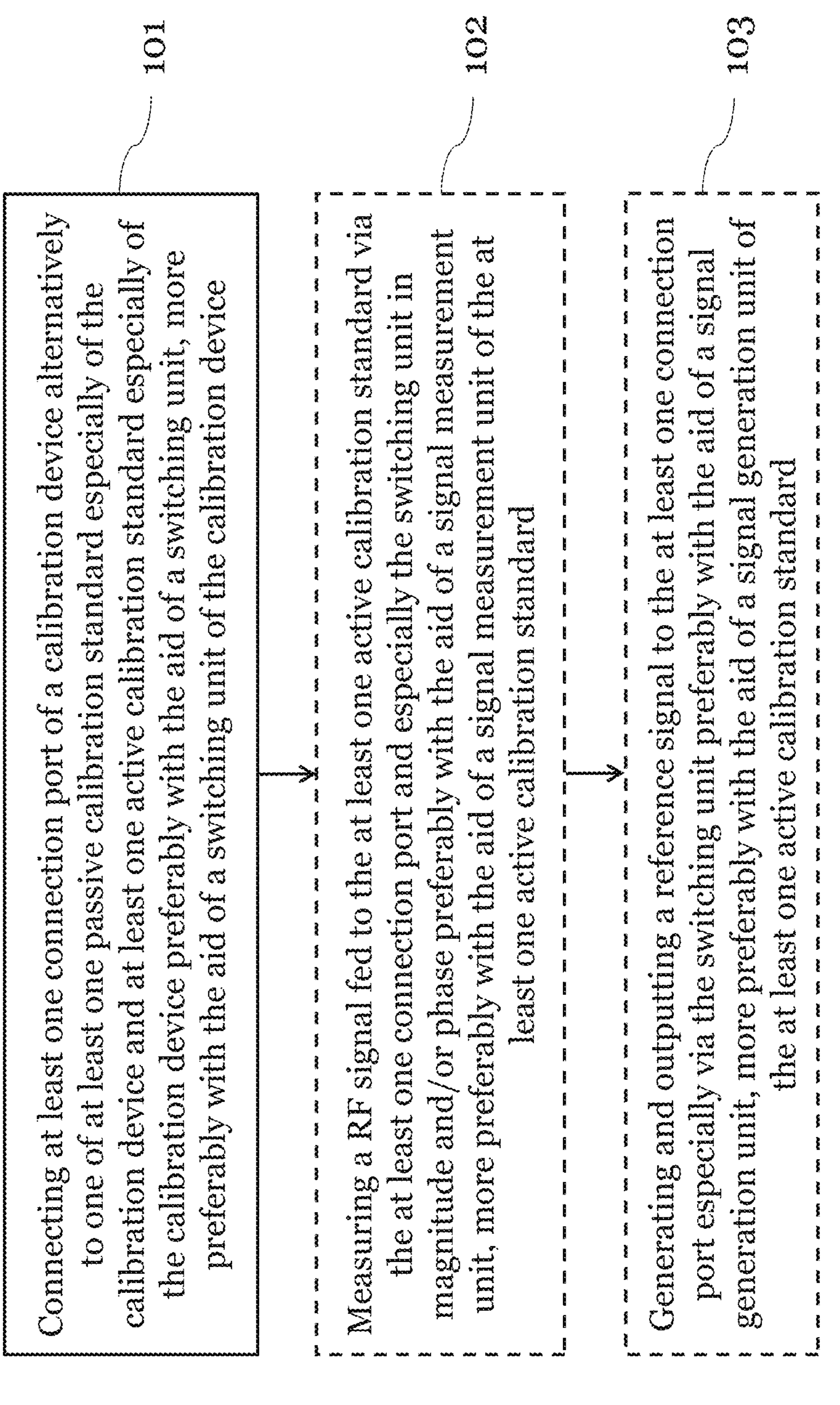
FIG. 9 shows a flow chart of an exemplary embodiment of the fourth aspect of the invention.

Finally, FIG. 9 shows a flow chart of an exemplary embodiment of the method for calibrating a vector network analyzer.

A first step 101 comprises connecting at least one connection port of a calibration device alternatively to one of at least one passive calibration standard especially of the calibration device and at least one active calibration standard especially of the calibration device preferably with the aid of a switching unit, more preferably with the aid of a switching unit of the calibration device. Furthermore, a step 102 comprises measuring a RF signal fed to the at least one active calibration standard via the at least one connection port and especially the switching unit in magnitude and/or phase preferably with the aid of a signal measurement unit, more preferably with the aid of a signal measurement unit of the at least one active calibration standard.

Alternatively, a step 103 comprises generating and outputting a reference signal to the at least one connection port especially via the switching unit preferably with the aid of a signal generation unit, more preferably with the aid of a signal generation unit of the at least one active calibration standard.

It is noted that it might be particularly advantageous if the method of FIG. 9 uses one of the calibration devices according to FIG. 1 to FIG. 8.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A calibration device for a measurement device comprising:

at least one connection port for connecting the calibration device to the measurement device, at least one further connection port, at least one passive calibration standard, at least one further passive calibration standard, at least one active calibration standard, and a switching unit configured to connect the at least one connection port alternatively to one of the at least one passive calibration standard and the at least one active calibration standard, wherein the at least one active calibration standard comprises a signal measurement unit configured to measure an RF signal fed to the at least one active calibration standard via the at least one connection port and the switching unit in magnitude and/or phase, or wherein the at least one active calibration standard comprises a signal generation unit configured to generate and output a reference signal to the at least one connection port via the switching unit, wherein the switching unit is configured to alternatively connect the at least one further connection port to the at least one further passive calibration standard and the at least one active calibration standard, and wherein the at least one active calibration standard is shared for the at least one connection port and the at least one further connection port.

2. The calibration device according to claim 1, wherein the calibration device comprises a control interface configured to connect the calibration device to a control device, wherein the switching unit is configured to receive a control signal via the control interface and is in turn configured to connect the at least one passive calibration standard and/or the at least one active calibration standard to the at least one connection port in respect to the control signal.

3. The calibration device according to claim 1, wherein the calibration device comprises at least one DUT connection port for connecting the calibration device to a DUT, wherein the switching unit is configured to connect the at least one connection port to the at least one DUT connection port.

4. The calibration device according to claim 1, wherein the switching unit is configured to connect the at least one connection port to the at least one further connection port.

5. The calibration device according to claim 1, wherein the switching unit comprises one or more switching stages.

6. The calibration device according to claim 1, wherein the switching unit comprises one or more switching elements, wherein the one or more switching elements comprise one or more electronic switching elements and/or one or more mechanical switching elements.

7. The calibration device according to claim 1, wherein the calibration device comprises a housing, wherein the at least one active calibration standard is arranged within said housing or in a housing separate to the housing of the calibration device.

8. The calibration device according to claim 1, wherein the at least one active calibration standard or the signal generation unit comprises or is a pulse source, a comb source, a noise source, or any combination thereof.

9. The calibration device according to claim 1, wherein the at least one passive calibration standard comprises or is an open calibration standard and/or a short calibration standard and/or a match calibration standard.

10. A method comprising:

calibrating a measurement device with the calibration device according to claim 1.

11. A system comprising:

a calibration device according to claim 1, and a measurement device, wherein the at least one connection port of the calibration device is connected to the measurement device.

12. The system according to claim 11, wherein the measurement device is configured to control the calibration device in a way that the at least one passive calibration standard and the at least one active calibration standard are connected to the measurement device in an alternative manner.

13. The system according to claim 11, wherein the measurement device is configured to measure at least one corresponding S-parameter.

14. A method for calibrating a measurement device, comprising the steps of:

connecting, by a switching unit of the calibration device, at least one connection port of a calibration device alternatively to one of at least one passive calibration standard of the calibration device and at least one active calibration standard of the calibration device, measuring, by a signal measurement unit of the at least one active calibration standard, an RF signal fed to the at least one active calibration standard via the at least one connection port and the switching unit in magnitude and/or phase, or generating and outputting, by a signal measurement unit of the at least one active calibration standard, a reference signal to the at least one connection port via the switching unit, alternatively connecting, by the switching unit of the calibration device, at least one further connection port to at least one further passive calibration standard and the at least one active calibration standard, wherein the at least one active calibration standard is shared for the at least one connection port and the at least one further connection port.

* * * * *